United States Patent [19]

Uytterhoeven et al.

[11] Patent Number: 5,308,739

[45] Date of Patent: May 3, 1994

[54] IMAGING ELEMENT COMPRISING AN IMPERMEABLE BARRIER LAYER PROVIDED BETWEEN A PHOTOSENSITIVE LAYER AND A POROUS LAYER

[75] Inventors: Herman Uytterhoeven, Bonheiden; Luc Bastiaens, Brasschaat, both of Belgium

[73] Assignee: Agfa-Gevaert, N.V., Mortsel, Belgium

[21] Appl. No.: 14,518

[22] Filed: Feb. 8, 1993

[30] Foreign Application Priority Data

Feb. 29, 1992 [EP] European Pat. Off. ........ 92200590.5

[51] Int. Cl.$^5$ ................................. G03C 3/00
[52] U.S. Cl. .................................... 430/258; 430/252; 430/256; 430/257; 430/259; 430/270; 430/275; 430/253
[58] Field of Search ............... 430/252, 253, 256, 257, 430/259, 275, 270, 258

[56] References Cited

U.S. PATENT DOCUMENTS

| | | | |
|---|---|---|---|
| 3,884,693 | 5/1975 | Bauer et al. | 430/263 |
| 4,599,295 | 7/1986 | Kondo et al. | 430/258 |
| 5,064,743 | 11/1991 | Koshizuka et al. | |

Primary Examiner—Charles L. Bowers, Jr.
Assistant Examiner—Geraldine Letscher
Attorney, Agent, or Firm—Breiner & Breiner

[57] ABSTRACT

The present invention provides an imaging element comprising a support, a porous layer, a photosensitive layer containing a photopolymerizable composition and optionally a stripping layer characterized in that there is provided a barrier layer between said photosensitive layer and said porous layer said barrier layer being impermeable for the photopolymerizable composition at ambient temperature and capable of increasing its permeability with increasing temperature.

10 Claims, No Drawings

IMAGING ELEMENT COMPRISING AN IMPERMEABLE BARRIER LAYER PROVIDED BETWEEN A PHOTOSENSITIVE LAYER AND A POROUS LAYER

DESCRIPTION

1. Field of the Invention

The present invention relates to an imaging element for the formation of images by means of photopolymerization using a dry development of the image. Furthermore the present invention relates to a method for the production of such an imaging element and to a method for obtaining an image with such an imaging element.

2. Background of the Invention

The use of photopolymerizable compositions for the production of images by information-wise exposure thereof to actinic radiation is well known. Several methods for forming images using photopolymerizable compositions are known. All these methods are based on the principle of introducing a differentiation in properties between the exposed and non-exposed parts of the photopolymerizable composition e.g. a difference in solubility, adhesion, conductivity, refractive index, tackiness, permeability, diffusibility of incorporated substances e.g. dyes etc.. The thus produced differences may be subsequently employed in a developing step to produce a visible image and/or master for printing e.g. a lithographic or electrostatic printing master.

A difference in solubility between the exposed and non-exposed parts of the photopolymerizable composition is often used for the production of lithographic printing plates where a hydrophilic base is coated with the photopolymerizable composition, subsequently exposed and developed using a solvent to remove the non-exposed or insufficiently exposed parts. Such a process is for example described in "Unconventional imaging processes" by E. Brinckman, G. Delzenne, A. Poot and J. Willems, Focal Press London-New York, first edition 1978, pages 33 to 39.

The use of the difference in tackiness to obtain an image is described in e.g. U.S. Pat. No. 3,060,024, 3,085,488 and 3,649,268. According to the method disclosed in these U.S. patents the image-wise exposed photopolymerizable composition looses its tackiness in the exposed parts while the non-exposed parts keep their tackiness. The non-exposed parts can therefore be colored with dry dye pigments to make the image visible.

According to the methods described in e.g. U.S. Pat. No. 3,245,796 and EP-A 362,827 the diffusibility of a dye is impeded in the photo-exposed parts of the photopolymerizable composition so that during an overall thermal heating subsequent to photo-exposure dye substances in the non-exposed areas will be able to diffuse to a receptor material. According to a similar method described in U.S. Pat. No. 4,587,198 the photopolymerizable composition is made impermeable in the exposed parts for a sublimable dye or dye-pigment present in a layer contiguous to the layer comprising the photopolymerizable composition.

According to a method disclosed in U.S. Pat. No. 3,060,023 the adhesion of the photopolymerizable composition is modified upon image-wise exposure. After image-wise exposure the non-exposed parts wills tick or adhere, during a step of overall heating, to a receiving sheet thus allowing the transfer of the non-exposed parts to the receiving sheet.

As illustrate above photopolymerization can be used in a variety of methods to reproduce images. Among these methods several are using dry-developing steps for producing the image which is convenient and offers an ecological advantage.

An especially interesting imaging element for obtaining images using photopolymerization and a dry development of the image is disclosed in EP 0 522 616 and EP 0 502 562. These applications disclose a so-called mono-sheet imaging element comprising on a transparent support e.g. a resin support comprising in the order given a photopolymerizable composition, a pigment layer and a receiving layer. After image-wise exposure of the imaging element the element is heated so that the insufficient hardened parts of the photopolymerizable layer are allowed to penetrate into the pigment layer and thereby improve the adherence of the pigment layer to the receiving layer. The receiving layer is then peeled off together with the image formed thereon.

A disadvantage of the above described mono-sheet imaging element is the poor stability of such imaging element probably because during storage the photopolymerizable layer tends to penetrate into the pigment layer. It is furthermore difficult to produce such an imaging element since one cannot avoid penetration of the photopolymerizable composition into the pigment layer when coating the photopolymerizable layer. Alternatively the imaging element may be produced by laminating 2 elements produced separately from each other. For example in a first stage the support of the imaging element may be provided with the photopolymerizable layer while the receiving layer, generally paper or an organic resin, is provided with the layer containing pigment. In the second stage both elements may be laminated to each other to obtain the imaging element. Even in this procedure care must be taken so as to avoid too much penetration of the photopolymerizable composition into the pigment layer. Further since the element comprising the pigment layer is produced separate from the element comprising the photopolymerizable layer great care should be taken to avoid damage of the pigment layer.

SUMMARY OF THE INVENTION

It is an object of the present invention to provide a mon0-sheet imaging element comprising on a support, a porous layer, a photosensitive layer containing a photopolymerizable composition and optionally a stripping layer having a high storage stability and that can yield images of high quality i.e. low fogging, high sharpness, high resolution, high density.

It is another object of the present invention to provide a method for making a mono-sheet imaging element comprising on a support, a porous layer, a photosensitive layer containing a photopolymerizable composition and optionally a stripping layer.

It is a further object of the present invention to provide a method for obtaining an image with such an imaging element.

Further objects will become clear from the description hereinafter.

According to the present invention there is provided an imaging element comprising a support, a porous layer, a photosensitive layer containing a photopolymerizable composition and optionally a stripping layer characterized in that there is provided a barrier layer between said photosensitive layer and said porous layer said barrier layer being impermeable for the photopolymerizable composition at ambient temperature and capable of increasing its permeability with increasing temperature.

According to the present invention there is also provided a method for obtaining the above defined imaging element.

According to the present invention there is also provided a method for obtaining an image with the above defined imaging element.

DETAILED DESCRIPTION OF THE INVENTION

It has been found that when a barrier layer is provided between the photosensitive layer and the porous layer the storage stability of the mono-sheet imaging element is improved. However most advantage of the barrier layer is obtained in the production of the imaging element as will be explained furtheron. When the barrier layer is absent images of poor quality that show a high level of fog are obtained.

According to the present invention the barrier layer should be impermeable at ambient temperature to avoid penetration of the photopolymerizable composition from the photosensitive layer into the porous layer during storage while the barrier layer should be permeable at an increased temperature used for penetration of non-hardened or insufficiently hardened parts of the photosensitive composition into the porous layer (thermal transfer) after image-wise exposure of the imaging element. By the term 'permeable' is to be understood that the photopolymerizable composition can diffuse through the barrier layer or that the photopolymerizable composition together with the barrier layer penetrates into the porous layer.

Preferably used barrier layers for use in accordance with the present invention are layers having a softening or melting temperature above ambient temperature but below the temperature used during thermal transfer. More preferably the barrier layer will have a softening or melting temperature between 35° C. and a temperature at least 10° C. below the temperature used during the thermal transfer step used for developing the imaging element. Most preferably the softening or melting temperature of the barrier layer is between 35° C. and 300° C. Preferably the barrier layer used in connection with the present invention comprises a hydrophilic polymer. Preferably used hydrophilic polymers in connection with the present invention are gelatin, polyvinylpyrrolidone or polyvinylalcohol. To adjust its softening or melting point the barrier layer may be partially hardened e.g. by an aldehyde type hardening agent and additional additives may be added e.g. plastizicers, silica, polymer latex particles etc.. Preferably the thickness of the barrier layer is between 0.05 g/m$^2$ and 2 g/m$^2$ and more preferably between 0.1 g/m$^2$ and 0.4 g/m$^2$.

Porous layers suitable for use in accordance with the present invention are layers having a sufficient porousity so that the softened or melted parts of the photosensitive layer and/or the barrier layer can penetrate into it as a consequence of capillary forces. Examples of such porous layers are e.g. layers containing mainly pigments or particulate material (hereinafter also called pigment layer) i.e. containing no or less than 40% by weight of a binder. According to the present invention the porous layer may also be formed by the surface of the support itself. An example of such a support is a roughened aluminum foil as described in e.g. DE-3717757, EP-A-167751, DE-3036174, U.S. Pat. No. 4,336,113, U.S. Pat. No. 4,374,710, U.S. Pat. No. 3,980,539, U.S. Pat. No. 3,072,546, U.S. Pat. No. 3,073,765, U.S. Pat. No. 3,085,950, U.S. Pat. No. 3,935,080 and U.S. Pat. No. 4,052,275. Since roughened aluminum foils are hydrophilic and the photosensitive layer can be choosen to be hydrophobic it is possible to obtain lithographic printing plates according to this embodiment. Preferably used porous layers in connection with the present invention are layers containing one or more pigments.

Suitable pigments for use in the porous pigment layer include, e.g. SiO$_2$, TiO$_2$, cooloidal carbon, graphite, phosphor particles, ceramics, clays, metal powder such as aluminum, copper, magnetic iron and bronze, dye pigments e.g. copper phtalocyanine, etc or mixtures thereof. These pigments may also be partially included in the photosensitive layer provided that they do not absorb excessive amounts of light at the exposure wavelength or inhibit the polymerization reaction. The layer containing pigment may further comprise additional additives such as e.g. ionic or non-ionic wetting agents, fluor containing surfactants, silicon containing surfactants, agents for stabilizing the pigment dispersion, agents for adjusting the adhesive properties of the layer etc..

For convenience the further description will be in terms of the preferred embodiment using a pigment layer as the porous layer.

According to a preferred method for the production of the imaging element according to the invention a support is coated with a pigment layer and barrier layer. Suitable coating techniques are for example slide hopper coating, curtain coating and gravure printing. The thus obtained element is then laminated preferably between 50° and 90° C. to an element comprising on a support that will serve as a stripping layer in the image forming process the photosensitive layer. The photosensitive layer may be provided to the stripping layer using simple coating techniques e.g. slide hopper coating or curtain coating or using gravure printing.

Alternatively the imaging element according to the present invention may be produced by coating to a support in the order given a pigment layer and a barrier layer. After drying the thus obtained element a photosensitive layer containing a photopolymerizable composition is coated thereto. Subsequent thereto but optionally the stripping layer may be laminated thereto. Because of the presence of the barrier layer on top of the pigment layer penetration of the photopolymerizable composition into the pigment layer is avoided during coating of the photosensitive layer.

According to a further alternative the imaging element according to the present invention may be produced by simultaneously coating e.g. using slide hopper coating or curtain coating the pigment layer, barrier layer and photosensitive layer and optionally also the stripping layer.

It has been found that imaging elements produced in accordance with one of the above described methods can yield images of little or no fog. Furthermore since the layer containing pigment is provided with a barrier layer on top thereof it is much less vulnerable during production of the imaging element.

According to the method of the present invention for obtaining an image an imaging element comprising on a support in the order given a pigment layer, a barrier layer and a photosensitive layer containing a photopolymerizable composition is image-wise exposed either through the support or from its photosensitive side to actinic radiation to cause image-wise hardening of the photosensitive layer. Subsequently the exposed imaging element is brought in contact with a stripping layer and heated therein causing the non-hardened or insufficient hardened parts of the photosensitive layer to penetrate through said barrier layer into said pigment layer so that the adherence of said pigment layer to the support is improved at these parts. Finally said stripping layer is peeled off therein removing the hardened parts of the photosensitive layer and the parts of the pigment layer adherent thereto.

According to an alternative method for obtaining an image the imaging element may be provided with the stripping layer before image-wise exposure.

obtain sharp images with camera exposures. The thickness of the stripping layer will be less critical when the imaging element is exposed using laser exposure since the laser beam can be focussed into the photosensitive layer. It will further be clear that either the support of the imaging element or the stripping layer when comprised in the imaging element before information-wise exposure thereof need to be transparent to the radiation used for information-wise exposure of the imaging element.

The photopolymerizable composition comprised in the photosensitive layer of the imaging element preferably contains urethane type monomers as disclosed in EP 0 502 562 and DE-A-4129284.7 filed Mar. 9, 1991. These type of monomers offer the advantage that they show a rapid polymerization and solidify even at low conversions of less than 10%. Examples of urethane type monomers are:

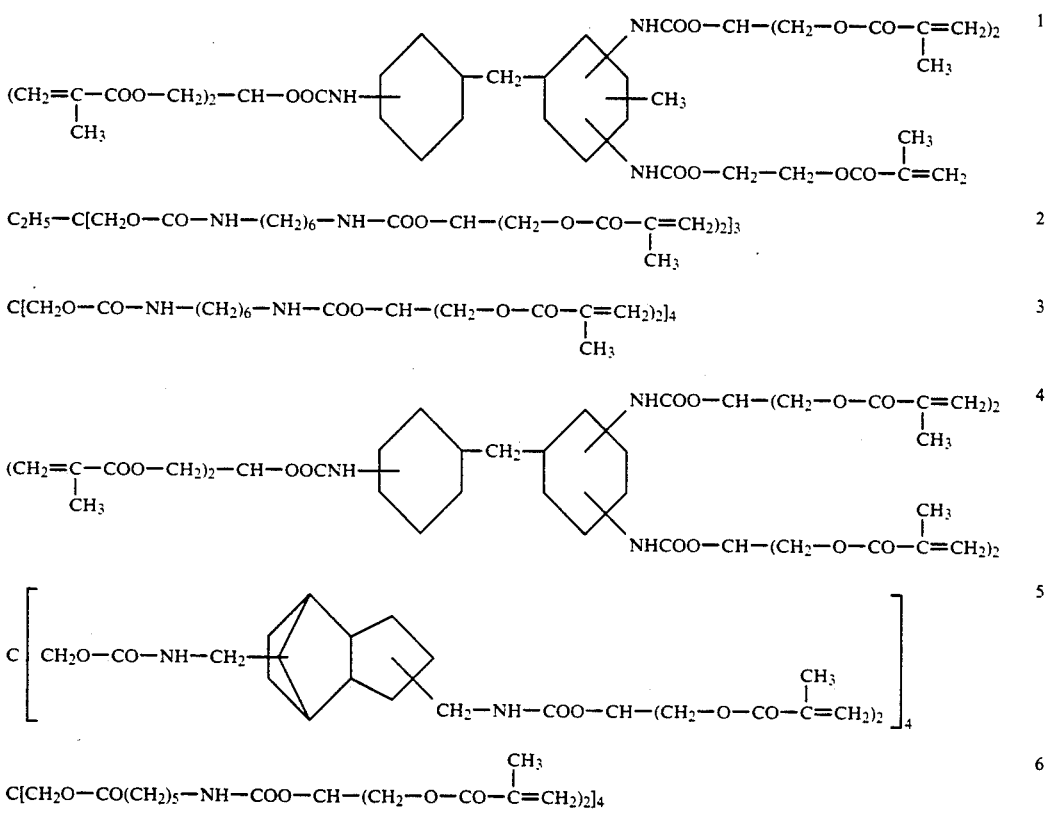

Preferably used supports for the imaging element in connection with the present invention are organic resins e.g. polyester film, polystyrene film, polycarbonate film, polypropylene film, paper supports etc..

Suitable stripping layers for use in accordance with the present invention are organic resin supports e.g. polyester film, polycarbonate, cellulose esters e.g. cellulose acetate, cellulose nitrate, polyvinyl chloride, polyimide, polypropylene, paper supports especially polyethylene laminated paper etc.. The supports mentioned for use as stripping layer in accordance with the present invention may contain additional layers e.g. improving adhesive properties thereof. When the imaging element is to be exposed through the stripping layer said stripping layer needs to be transparent to the radiation sued for image-wise exposure. In this case the stripping layer preferably has a thickness between 3 μm and 60 μm to Other types of monomers suitable for use in the photopolymerizable composition used in accordance with the present invention are e.g. The monomers disclosed in DEOS no. 4,005,231, 3,516,256, 3,516,257 and 3,632,657, unsaturated esters of polyols, particularly such esters of the alpha-methylene carboxylic acids, e.g. ethylene diacrylate, glycerol tri(meth)acrylate, ethylene dimethacrylate, 1,3-propanediol di(meth)acrylate 1,2,4-butanetriol tri(meth)acrylate, 1,4-cyclohexanediol di(meth)acrylate, 1,4-benzenediol di(meth)acrylate, pentaerythritol tetra(meth)acrylate, 1,5-pentanediol di(meth)acrylate, the bis acrylates and methacrylates of polyethylene glycols of molecular weight 200-500, and the like: unsaturated amides, particularly those of the alphamethylene carboxylic acids, and especially those of alpha-omega-diamines and oxygen-interrupted omega-diamines, such as methylene bis-acrylamide, methylene bis-methacrylamide, 1,6-hexamethylene bis-acrylamide, diethylene triamine tris-methacrylamide, bis)gamma-methacrylamidopropoxy)ethane, betamethacrylamidoethyl methacrylate. N-(beta-hydroxyethyl)-beta-(methacrylamido)ethyl acrylate and N,N-bis(beta-methacrylolyoxyethyl)acrylamide; vinyl esters e.g. divinyl succinate, divinyl adipate, divinyl phthalate, divinyl butane-1,4-disulfonate; and unsaturated adlehydes, e.g. sorbaldehyde (hexadienal). The photopolymerizable composition may also comprise polymers and/or oligomers comprising 2 or more polymerizable functions e.g. acrylated epoxies, polyester acrylates, urethane acrylates etc.. It will be clear that these monomers and/or polymers and/or oligomers can be used in admixture.

The photopolymerizable composition used in accordance with the present invention also comprises at least one photoinitiator. Preferably used photoinitiators are polymerization initiators activatable by actinic light and thermally inactive at and below 185° C. Examples of such initiators include the substituted or unsubstituted polynuclear quinones which are compounds having tow intracyclic carbonyl groups attached to intracylic carbon atoms in a conjugated six-membered carbocyclic ring, there being at least one aromatic carbocyclic ring fused to the ring containing the carbonyl groups. Such initiators include 9-10-anthraquinone, 1-chloroanthraquinone, 2-chloroanthraquinone, 2-methylanthraquinone, 2-tert-butylanthraquinone, octamethylanthraquinone, 1,4-naphtoquinone, 9,10-phenanthrenequinone, 1-2-benzanthraquinone, 2,3-dichloronaphthoquinone, sodium salt of anthraquinone a alpha-sulfonic acid, 3-chloro-2-methylanthraquinone, and 1,2,3,4-tetrahydrobenzene a anthracene-7,12-dione. The photoinitiators which are also useful are described in Plambeck U.S. Pat. No. 2,760,863 and include vicinal ketaldonyl compounds, such as diacetyl, benzil, etc. alpha-ketaldonyl alcohols, such as benzoin, pivalon, etc. acyloin esters e.g. benzoin methyl and ethyl ethers, etc.; alpha-hydrocarbon substituted aromatic acyloins, including mehtylbenzoin, alpha-allylbenzoin, and alpha-phenylbenzoin. Still further photoinitiators useful in accordance with the present invention are those disclosed in "Photoreactive Polymers" by Arnost Reiser. "Organic photochemical imaging systems" by G. A. Delzenne, in the paper "UV-Curing Chemistry: Past, Present, and Future" by Christian Decker, published in J. of Coatings Technology, Vol. 59, No. 751, August 1987, pages 97–106, in EP-A 362,827, and U.S. Pat. No. 3,558,309.

The weight ratio of photoinitiator to the polymerizable compound(s) in the photopolymerizable composition is preferably between 1:1 and 1:10.

According to the present invention thermal polymerization inhibitors may also be added to the photopolymerizable composition. Inhibitors for use in accordance with the present invention are p-methoxyphenol, hydroquinone, alkyl and acyl-substituted hydroquinones and quinones, tert-butylcatechol, pyrogallol, copper resinate, naphtylamines, beta-naphtol, cuprous chlordie, 2,6-di-tert-butyl p-cresol, photothiazine, pyridine, nitrogenzene and dinitrobenzene, p-toluquinone and chloranil.

According to an alternative embodiment of the present invention the photopolymerizable composition may comprise one or more monomers that can be cationically polymerized. For example the photopolymerizable composition may comprise an epoxy monomer and a cationic photoinitiator. Cationic photopolymerization offers the advantage over radical polymerization that the former is not susceptible to inhibition by oxygen. Suitable cationic photopolymerizable compositions that can be used in carrying out the method of the present invention can be chosen from the many existing organic photoreactive compositions such as those described in "Photoreactive Polymers" by Arnost Reiser, John Wiley & Sons, New York., in a paper entitled "UV curing of epoxides by cationic polymerization" published by William R. Watt in Radiation Curing (November 1986) p. 7–25, in the offprint entitled "Organic photochemical imaging system" by G. A. Delzenne, from Advances in Photochemistry, Volume 11, Edited by John Wiley in 1979, in "Light-sensitive Systems" by Jaromir Kosar, edited in 1965 by John Wiley & Sons, New York., and in the literature referred to in theses documents.

According to a preferred mode of the present invention the photosensitive layer containing the phototpolymerizable composition is a thermoplastic layer comprising a thermoplastic polymer. Said thermoplastic layer is preferably solid at temperatures below 40° C. and is transferable in the non-exposed or insufficiently exposed parts at temperature between 40° C. and 250° C.

Suitable thermoplastic polymers for use in accordance with the present invention include:

(A) Copolyesters, e.g. those prepared from the reaction product of an alkylene glycol e.g. polymethylene glycol of the formula $HO(CH_2)_vOH$, wherein v is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids.

(B) Nylons or polyamides, e.g. N-methoxymethyl polyhexamethylene adipamide;

(C) Vinylidene chloride copolymers, e.g. vinylidene chloride/acrylonitrile; vinylidene chloride/methylacrylate and vinylidene chloride/vinylacetate copolymers;

(D) Ethylene/vinyl acetate copolymer;

(E) Cellulosic ethers, e.g. methyl cellulose, ethyl cellulose and benzyl cellulose;

(F) Polyethylene;

(G) Synthetic rubbers, e.g. butadiene/acrylonitrile copolymers, and chloro-2-butadiene-1,3 polymers;

(H) Cellulose esters, e.g. cellulose acetate, cellulose acetate succinate and cellulose acetate butyrate, cellulose nitrate;

(I) Polyvinyl esters, e.g. polyvinyl acetate/acrylate, polyvinyl acetate/methacrylate and polyvinyl acetate;

(J) Poly(meth)acrylate and alpha-alkyl poly(meth)acrylate esters, e.g. polymethyl methacrylate and polyvinyl acetate;

(K) High molecular weight polyethylene oxides of polyglycols having average molecular weights from about 4,000 to 1,000,000;

(L) Polyvinyl chloride and copolymers, e.g. polyvinyl chloride/acetate, polyvinylchloride/acetate/alkohol;

(M) Polyvinyl acetal, e.g. polyvinyl butyral, polyvinyl formal;

(N) Polyformaldehydes;

(O) Polyurethanes and copolymers;
(P) Polycarbonate and copolymers;
(Q) Polystyrenes and copolymers e.g. polystyrene/acrylonitrile, polystyrene/acrylonitrile/butadiene.

To the thermoplastic polymer constituent of the photosensitive layer there can be added non-thermoplastic polymeric compounds to give certain desirable characteristics, e.g. to improve adhesion to the support or underlying layers used in accordance with the present invention, adhesion to the receptor support on transfer, wear properties, chemical inertness, etc. Suitable non-thermoplastic polymeric compounds include polyvinyl alcohol, cellulose, anhydrous gelatin, phenolic resins and melamine-formaldehyde resins, etc. If desired, the photopolymerizable layers can also contain immiscible polymeric or non-polymeric organic or inorganic fillers or reinforcing agents which are essentially transparent at the wave-lengths used for the exposure of the photopolymeric material, e.g. The organophilic silicas, bentonites, silica, powdered glass, colloidal carbon, as well as various types of dyes and pigments in amounts varying with the desired properties of the photopolymerizable layer. The fillers are useful in improving the strength of the composition, reducing tack and in addition, as coloring agents.

Agents to improve the wetting and/or adjust the adhesion of the thermoplastic layer may be added. Suitable agents are e.g. silicons, silicon containing polymers e.g. a poly(dimethylsiloxane)-polyether copolymer, poly(dimethylsiloxane)-polyester, silicon containing surfactants, fluor containing copolymers can fluor containing surfactants etc..

Various dyes, thermographic compounds, UV-absorbers, anti-oxidants and color forming components can be added to the photopolymerizable compositions to give a variety of results after the thermal transfer. These additive materials, however, preferably should not absorb excessive amounts of light at the exposure wavelength or inhibit the polymerization reaction.

Useful thermographic additives, e.g. 3 cyano-4,5-dimethyl-5-hydroxy-3-pyrrolin-2-one, and activators, e.g. copper acetate, are disclosed in the application of Holland and Wayrynen, Ser. No. 807,761, filed Apr. 21, 1959, and the following U.S. Pat. Nos. 2,825,494, 2,637,657, 2,665,654, 2,663,655, 2,663,656, and 2663,657.

According to a preferred embodiment of the present invention a base layer is provided between the stripping layer and the photosensitive layer. When the stripping layer is not contained on the imaging element the base layer may be a surface layer. Said base layer preferably comprises a polymer containing polymerizable ethylenically unsaturated groups. Examples of polymers containing polymerizable ethylenically unsaturated groups for use in said base layer are polymers comprising vinyl groups, allyl groups, (meth)acrylate groups, butadiene groups, isoprene groups etc., e.g. acrylated epoxies, polyester acrylates, urethane acrylates etc.. Further additives may be added to said base layer as disclosed in EP-A-91201824.9. It is however important with respect to the present invention that the base layer is sufficiently transparent to the radiation used for exposure of the photosensitive layer.

The present invention will now be illustrated by the following examples without however limiting it thereto. All percentages are by weight unless otherwise specified.

EXAMPLE 1

To a polyester film serving as a stripping layer in the image forming process and having a thickness of 5 μm were applied in the order given the following 3 layers using gravure printing:

1) a subbing layer containing a copolyester of isophtalic acid (40 mol % of the total amount of acid), terephthalic acid (53 mol % of the total amount of acid), sulphoisophtalic acid sodium salt (7 mol % of the total amount of acid) and ethylene glycol at a dry thickness of 0.13 g/m$^2$ 2) a base layer containing polyvinyl alcohol of which 25 mol % of the hydroxyl groups were modified with methacryloyl chloride to a dry layer thickness of 1 g/m$^2$ 3) a photosensitive layer having a total layer thickness of 4.3 g/m$^2$ and containing compound 2 mentioned above in an amount of 2.38 g/m$^2$, benzimidazol in an amount of 1.64 g/m$^2$, mercapto benzoxazole in an amount of 0.096 g/m$^2$, Michlers keton in an amount of 0.048 g/m$^2$ and a blue dye (C. I. 61551) in an amount of 0.14 g/m$^2$.

To a support consisting of a polyester film having a thickness of 100 μm were simultaneously coated using slide hopper coating in the order given an aqueous dispersion containing 4% of carbon black, 0.8% of polyvinyl pyrrolidone and 0.6% of a wetting agent at a dry layer thickness of 1 g/m$^2$ and an aqueous solution containing 1.5% of gelatin at a dry layer thickness of 0.2 g/m$^2$.

Both elements were subsequently laminated to each other in a LPP 650 laminator (commercially available from Dorned) at a temperature of 70° C. and a rate of 0.6 m/min.

The thus obtained imaging element was information-wise exposed using a Betascreen original through the polyester film stripping layer of 5 μm in a Dupliphot apparatus (commercially available form Agfa-Gevaert N. V.) with an output of 200 illumination units. The information-wise exposed imaging element was subsequently guided through the above mentioned LPP 650 laminator at 70° C., a rate of 0.48 m/min. The polyester film stripping layer was the peeled off and an image of high quality was obtained on the support. In addition the 3% dots to 97% dots of a screen containing 150 lines per inch were all reproduced and the image was free of fog.

EXAMPLE 2

To a support consisting of a polyester film having a thickness of 100 μm were simultaneously coated using slide hopper coating in the order given an aqueous dispersion containing 4% of carbon black, 0.8% of polyvinyl pyrrolidone and 0.6% of a wetting agent at a dry layer thickness of 1 g/m$^2$ and an aqueous solution containing 1.5% of gelatin at a dry layer thickness of 0.2 g/m$^2$.

The thus obtained layer package was allowed to dry and subsequently overcoated in the order given with a photosensitive layer having a total layer thickness of 5.48 g/m$^2$ and containing compound 2 mentioned above in an amount of 3.15 g/m$^2$, benzimidazol in an amount of 2.18 g/m$^2$, mercapto benzoxazole in an amount of 0.113 g/m$^2$, Michlers keton in an amount of 0.038 g/m$^2$ and a layer containing polyvinyl alcohol of which 25 mol % of the hydroxyl groups were modified with methacryloyl chloride to a dry layer thickness of 1.13 g/m²

The obtained imaging element was image-wise exposed from its photosensitive side as described in example 1. The exposed imaging element was then guided through a LPP 650 laminator operating at 100° C. and a speed of 0.85 m/min, whilst in contact with a polyethylene terephtalate film as a stripping layer having a thickness of 100 μm. The stripping layer was then peeled off and an image of high quality was obtained on the support of the imaging element.

We claim:

1. An imaging element comprising a support, a porous layer, a photosensitive layer containing a photopolymerizable composition and optionally a stripping layer characterized in that there is provided a barrier layer between said photosensitive layer and said porous layer said barrier layer being impermeable for the photopolymerizable composition at ambient temperature and capable of increasing its permeability with increasing temperature.

2. An imaging element according to claim 1 wherein said barrier layer is capable of increasing its permeability with increasing temperature to such an extent that said photosensitive layer can penetrate through said barrier layer.

3. An imaging element according to claim 1 wherein said barrier layer has a softening or melting temperature between 35° C. and 300° C.

4. An imaging element according to claim 1 wherein said barrier layer comprises a hydrophilic polymer.

5. An imaging element according to claim 4 wherein said hydrophilic polymer is gelatin, polyvinylpyrrolidone or polyvinyl alcohol.

6. An imaging element according to claim 1 wherein said photopolymerizable composition comprises multifunctional monomers.

7. An imaging element according to claim 1 wherein said porous layer contains a pigment.

8. An imaging element according to claim 1 wherein said porous layer is formed by the surface of said support.

9. An imaging element according to claim 8 wherein said support is a roughened aluminum foil.

10. A method for making an imaging element by coating to a support a porous layer, a barrier layer being impermeable for the photopolymerizable composition at ambient temperature an capable of increasing its permeability with increasing temperature and a photosensitive layer containing a photopolymerizable composition and optionally laminating or coating thereto a stripping layer.

* * * * *